US008531849B1

(12) United States Patent
Abdulla et al.

(10) Patent No.: US 8,531,849 B1
(45) Date of Patent: Sep. 10, 2013

(54) SUPPLY VOLTAGE OR GROUND CONNECTIONS INCLUDING BOND PAD INTERCONNECTS FOR INTEGRATED CIRCUIT DEVICE

(75) Inventors: Mostafa Naguib Abdulla, Rancho Cordova, CA (US); Steven Eskildsen, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 399 days.

(21) Appl. No.: 12/751,695

(22) Filed: Mar. 31, 2010

(51) Int. Cl.
*H05K 7/10* (2006.01)
(52) U.S. Cl.
USPC ............................................... 361/808
(58) Field of Classification Search
USPC ............ 361/808, 752, 757, 758, 768, 775, 361/807, 809, 830; 174/252, 255
See application file for complete search history.

(56) References Cited

U.S. PATENT DOCUMENTS

| 6,700,207 | B2 | 3/2004 | Pekin et al. |
| 7,071,574 | B1 | 7/2006 | Nojiri et al. |
| 7,297,572 | B2 | 11/2007 | Salmon |
| 2004/0042188 | A1* | 3/2004 | Hsu ............................... 361/764 |
| 2007/0297157 | A1* | 12/2007 | Tanaka ........................... 361/766 |
| 2009/0316326 | A1* | 12/2009 | Chiles ............................. 361/232 |

* cited by examiner

*Primary Examiner* — Jeremy Norris
*Assistant Examiner* — Tremesha S Willis
(74) *Attorney, Agent, or Firm* — Knobbe Martens Olson & Bear LLP

(57) ABSTRACT

Embodiments disclosed herein may relate to supply voltage or ground connections for integrated circuit devices. As one example, two or more supply voltage bond pads on an integrated circuit die may be connected together via one or more electrically conductive interconnects.

19 Claims, 9 Drawing Sheets

SUPPLY VOLTAGE OR GROUND CONNECTIONS INCLUDING BOND PAD INTERCONNECTS FOR INTEGRATED CIRCUIT DEVICE

BACKGROUND

Subject matter disclosed herein may relate to integrated circuit devices, and may relate more particularly to supply voltage or ground connections for integrated circuit devices.

Integrated circuit devices, such as memory devices, for example, may be found in a wide range of electronic devices. For example, memory devices may be used in computers, digital cameras, cellular telephones, personal digital assistants, etc. Integrated circuit device performance may be affected at least in part by operating clock frequency. Operating clock frequency may be limited at least in part by signal integrity issues. For example, an improvement in signal integrity may allow for an increase in operating clock frequency that may result in improved integrated circuit device performance. A degradation in signal integrity may suggest a decrease in operating clock frequency to help provide reliable operation at a given operating clock frequency A reduction in operating clock frequency may result in reduced integrated circuit device performance.

BRIEF DESCRIPTION OF THE DRAWINGS

Claimed subject matter is particularly pointed out and distinctly claimed in the concluding portion of the specification. However, both as to organization or method of operation, together with objects, features, or advantages thereof, it may best be understood by reference to the following detailed description if read with the accompanying drawings in which:

Figure 1:
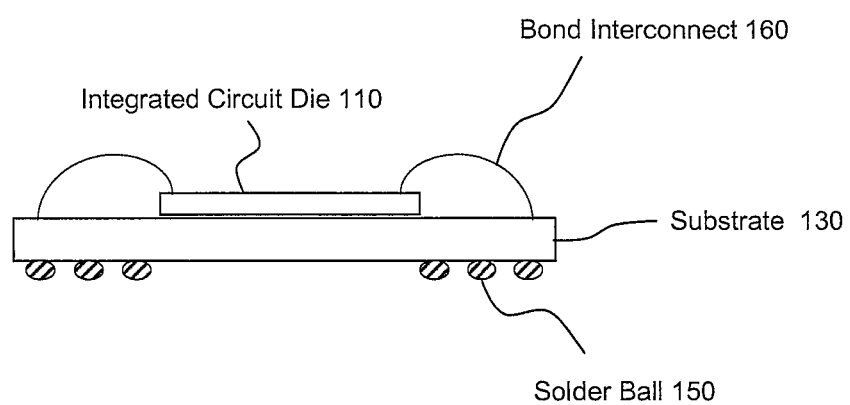
FIG. 1 is an illustration depicting a side view of an example embodiment of an integrated circuit device.

Reference is made in the following detailed description to the accompanying drawings, which form a part hereof, wherein like numerals may designate like parts throughout to indicate corresponding or analogous elements. It will be appreciated that for simplicity or clarity of illustration, elements illustrated in the figures have not necessarily been drawn to scale. For example, dimensions of some of elements may be exaggerated relative to other elements for clarity. Further, it is to be understood that other embodiments may be utilized. Furthermore, structural or logical changes may be made without departing from claimed subject matter. It should also be noted that directions or references, for example, up, down, top, bottom, and so on, may be used to facilitate discussion of drawings and are not intended to restrict application of claimed subject matter. Therefore, the following detailed description is not to be taken to limit scope of claimed subject matter or any equivalents.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, methods, apparatuses or systems that would be known by one of ordinary skill have not been described in detail so as not to obscure claimed subject matter.

As discussed above, integrated circuit device performance may be affected at least in part by operating clock frequency. Operating clock frequency may be limited at least in part by signal integrity issues. An improvement in signal integrity may allow for an increase in operating clock frequency that may result in improved integrated circuit device performance. A degradation in signal integrity may suggest a decrease in operating clock frequency in order to help provide reliable operation at a given operating clock frequency. A reduction in operating clock frequency may result in reduced integrated circuit device performance. Signal integrity, however, may be affected by any of a wide range of factors. One factor that may affect signal integrity may include switching noise that may result from a relatively large number of output driver circuits switching state substantially simultaneously or concurrently, for example.

For example, substantially simultaneous switching noise voltage levels may be represented by the following relationship:

$$V_{noise} = L\, di/dt \quad (1)$$

wherein 'L' represents inductance in power or ground nets and wherein di/dt represents a rate of change in current per unit time. Rate of change in current may be increased by increasing operating clock frequency or frequency of interface circuitry for an integrated circuit device. As can be seen in relationship (1), a reduction in inductance in power or ground nets may result in a reduction in switching noise.

As used herein, the term "integrated circuit device" refers to any electronic component or device that incorporates one or more integrated circuit die or a portion thereof. As used herein, the term "net" may refer to a "network" or may refer to a physical instantiation of a "net-list". Thus, a supply voltage net, as it relates to an integrated circuit device, may refer to one or more electrically conductive interconnects electrically connected to distribute a supply voltage to one or more bond pads of one or more integrated circuit die in an integrated circuit device. Similarly, a ground voltage net as it relates to an integrated circuit device may refer to one or more electrically conductive interconnects electrically connected to distribute a ground voltage to one or more bond pads or one or more integrated circuit die in an integrated circuit device. As used herein, the term "interconnected" refers to a connection among two or more integrated circuit device components. For example, two or more bond pads may be said to be "interconnected" if the bond pads are electrically connected one to another such that the bond pads are at an approximately identical voltage potential at a given time. Also, as used herein, term "connected" may refer to a direct, point-to-point connection, or may refer to an indirect connection.

As previously mentioned, memory devices represent an example type of electronic device. Memory devices may find utility in any number of applications such as cellular telephones, personal digital assistants, digital cameras, notebook computers, or other computing platforms, to name but a few examples. For at least some memory system or subsystem implementations, a two-layer Ball Grid Array (BGA) package type may be utilized. An implementation may include, for example, one or more stacked die from one or more various technologies, such as low-power double data rate memory (LPDDR), dynamic random access memory (DRAM), or non-volatile memory (NVM), for example, although claimed subject matter is not limited in scope in these respects. For a two-layer substrate BGA package implementation, for example, operating clock frequencies may range from approximately 50 MHz to 166 MHz, for one or more embodiments. Operating clock frequency may be limited, for one or more example implementations, by number of stacked die or by size of an integrated circuit device package, for example. Also, for an example two-layer substrate BGA package implementation, inductance in supply voltage or ground nets may increase with an increase in number of stacked die or with an increase in package size.

In an embodiment, extra power or ground layers may be added to a BGA package to reduce inductance in supply voltage or ground nets, thereby allowing for an increase in operating clock frequency. However, an implementation may undesirably result in increased manufacturing resources or cost.

In another embodiment, two or more supply voltage or two or more ground voltage bond pads may be electrically interconnected to reduce inductance in supply voltage or ground nets. In further embodiment, two or more supply voltage or two or more ground voltage bond fingers may be electrically interconnected to reduce inductance in supply voltage or ground nets. In additional embodiments, two or more supply voltage or two or more ground voltage solder balls may electrically interconnected to reduce inductance. Possible embodiments are discussed more fully, below.

FIG. 1 is an illustration depicting a side view of an example embodiment of an integrated circuit device. Integrated circuit device embodiment 100 comprises an integrated circuit die 110 mounted to a substrate 130. Bond interconnects 160 may electrically connect bond pads (not shown) on integrated circuit die 110 to bond fingers (not shown) formed on a top surface of a substrate 130. For an example embodiment, bond interconnects 160 may comprise wires, although claimed subject matter is not limited in scope in this respect. Solder balls 150 may be positioned on a bottom side of substrate 130. Solder balls 150 may be electrically connected to respective bond fingers on a top of substrate 130 via electrical traces, interconnects (not shown), or vias extending through substrate 130 (also not shown). Substrate 130 may comprise a printed-circuit board (PCB) for an embodiment, although claimed subject matter is not limited in scope in this respect. Further, for an embodiment, integrated circuit die 110 and at least a portion of substrate 130 may be encapsulated by plastic or by another material, although again claimed subject matter is not limited in scope in these respects. Encapsulation material is not depicted in FIG. 1 to allow visibility to other components of integrated circuit device 100.

As used herein, the term "bond pad" refers to an electrically conductive area on an integrated circuit die electrically connected to one or more input or output circuits of an integrated circuit. Also, as used herein, the term "bond finger" refers to an electrically conductive area on a substrate that may receive an electrically conductive interconnect from a bond pad. For an embodiment, for example, a bond wire may electrically connect a bond pad of an integrated circuit to a bond finger positioned on a substrate. In an example embodiment of a BGA package, a bond finger may further be electrically connected to a solder ball, although claimed subject matter is not limited in scope in this respect.

Although an example embodiment of integrated circuit device 100 depicted in FIG. 1 may implement a ball-grid array package configuration, claimed subject matter is not limited in scope in this respect. Also, although example embodiments may utilize a single integrated circuit die, other embodiments may include a greater number of integrated circuit die, and claimed subject matter is not limited in scope in this respect.

Figure 2A:
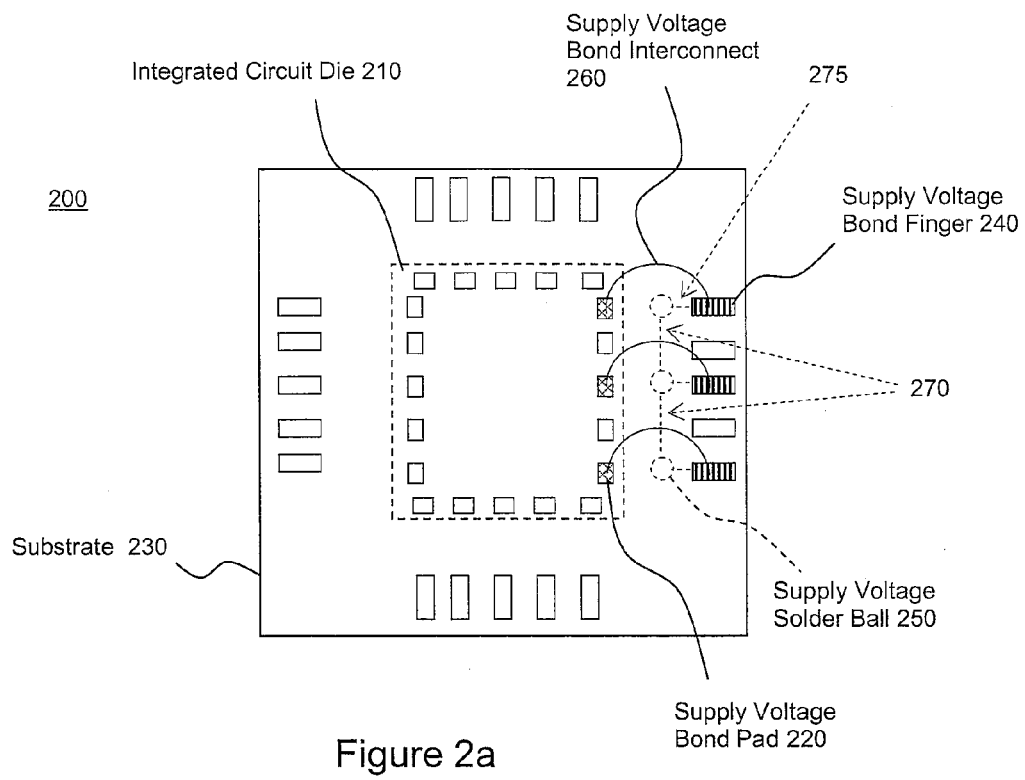
FIG. 2a is an illustration depicting a top view of an example embodiment of an integrated circuit device.

FIG. 2a is an illustration depicting a top view of an example embodiment of an integrated circuit device. Integrated circuit device embodiment 200 comprises an integrated circuit die 210 mounted to a substrate 230. Integrated circuit die 210 may comprise a number of bond pads positioned around the periphery of die 210. Other embodiments may incorporate bond pads positioned at least in part in locations other than around a periphery of an integrated circuit die. For an embodiment, a plurality of bond pads may comprise supply voltage bond pads 220. Of course, bond pads may be provided for a variety of input or output signal types in addition to supply voltages or ground connections. However, other signal types are not depicted to reduce potential confusion. Also, it may be noted that embodiments may utilize a greater amount of bond pads than shown in FIG. 2a. Illustrated bond pads are limited to a relatively small number in FIG. 2a and in other figures to reduce potential confusion.

Supply voltage bond pads 220 may be electrically connected to a plurality of respective supply voltage bond fingers 240, which may in turn be electrically connected to a respective plurality of supply voltage solder balls 250. A plurality of supply voltage bond interconnects 260 may electrically connect supply voltage bond pads 220 to supply voltage bond fingers 240. Electrically conductive traces 275 positioned on, or in, top or bottom surfaces or layers of substrate 230, as well as electrically conductive vias (not shown) extending from a top surface to a bottom surface of substrate 230, may electrically connect supply voltage bond fingers 240 to supply voltage solder balls 250, for example. In this manner, a supply voltage applied to supply voltage solder balls 250 may be electrically connected to integrated circuit die 210 by way of electrically conductive vias, electrically conductive traces 275, supply voltage bond fingers 240, supply voltage bond interconnects 260, or supply voltage bond pads 220. Electrical connections 270 may be positioned between supply voltage solder balls 250 on a bottom surface of substrate 230 to electrically interconnect two or more solder balls 250, for an example embodiment. Although, for an example embodiment, electrical connections 270 between supply voltage solder balls 250 are described as being positioned on, over, or in a bottom surface or a bottom layer of substrate 230, other embodiments are possible utilizing electrical connections that are positioned in, over, or on one or more of a bottom layer, a top layer, or an intermediate layer of a substrate. Further, although substrate 230 is described as comprising two layers, other embodiments may employ more than two layers. Of course, scope of claimed subject matter is not limited in scope in these respects.

Although example embodiments shown depict a one-to-one correspondence between supply voltage bond pads 220 and supply voltage bond fingers 240, claimed subject matter is not limited in scope in this respect. Similarly, example embodiments may depict a one-to-one correspondence between supply voltage bond fingers 240 and supply voltage solder balls 250, although claimed subject matter is again not limited in scope in these respects.

Figure 2B:
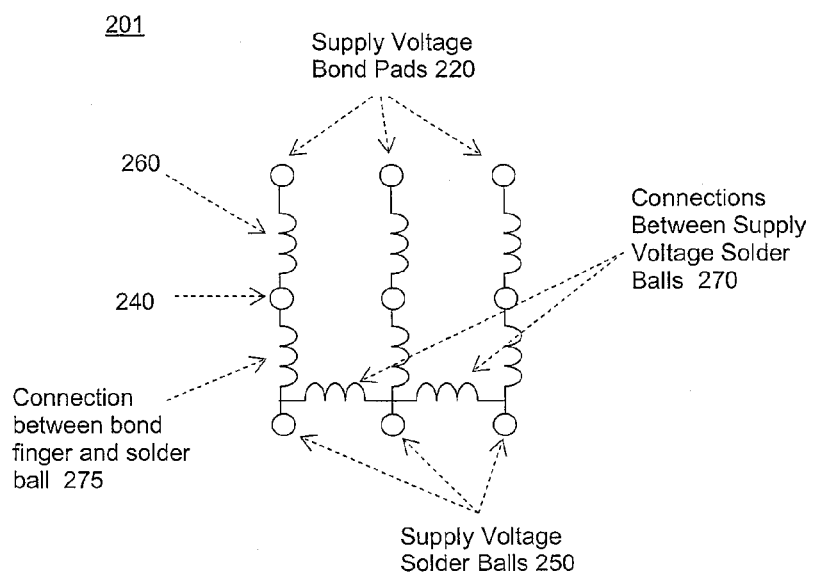
FIG. 2b is a schematic diagram depicting an equivalent circuit of an example embodiment of an integrated circuit device.

FIG. 2b is a schematic diagram depicting an equivalent circuit 201 of a supply voltage net of an example embodiment of integrated circuit device 200, as depicted in FIG. 2a. Inductances inherent in electrical connections between supply voltage bond pads 220 and supply voltage solder balls 250 may be represented by a network of inductors. For example, FIG. 2b depicts inductors representing supply voltage bond interconnects 260 positioned between supply voltage bond pads 220 and supply voltage bond fingers 240, and also depicts inductors representing electrical connections 275 positioned between supply voltage bond fingers 240 and supply voltage solder balls 250. A pair of inductors are also utilized to represent electrical connections 270 positioned between supply voltage solder balls, as depicted in FIG. 2a. It may be noted that example equivalent circuit 201 comprises a network of inductors characterized by a combination of series or parallel connections. It may also be noted that if inductors are connected in series, total inductance is the sum of individual inductances. It may be noted that a total inductance of two or more parallel inductive components is smaller than a smallest inductance of any individual inductive component. Thus, total inductance in a supply voltage net represented by example equivalent circuit 201 may be reduced by adding parallel connections. For example, connections 270 between supply voltage solder balls 250 provide a reduced overall inductance than would otherwise be possible without electrical connections 270.

Figure 3A:
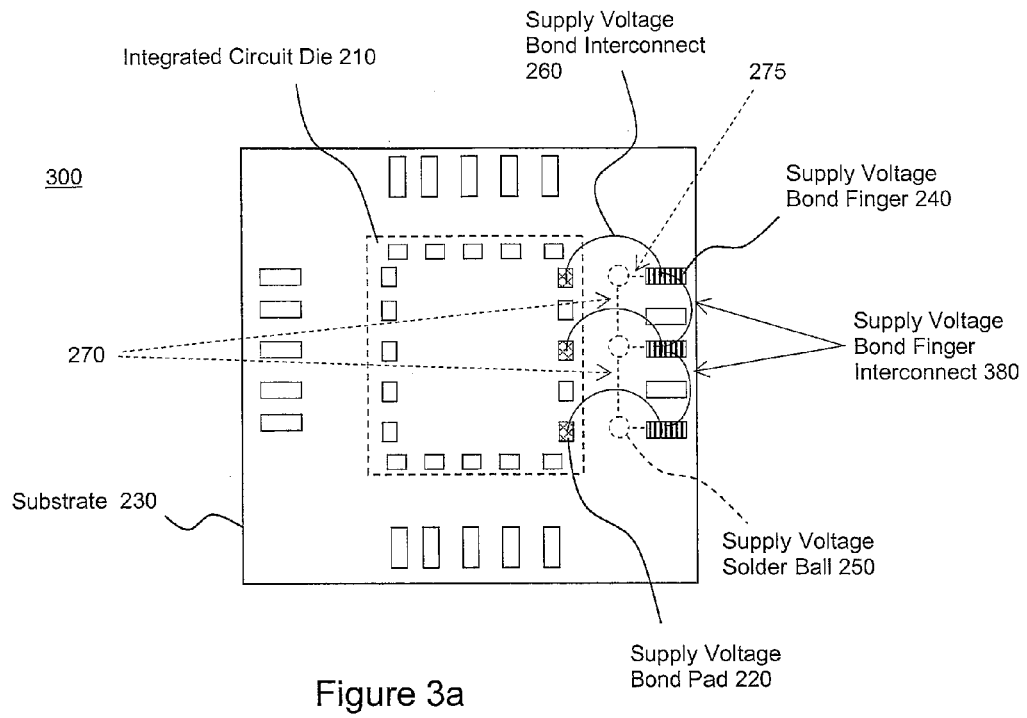
FIG. 3a is an illustration depicting a top view of an example embodiment of an integrated circuit device.

FIG. 3a is an illustration depicting a top view of an example embodiment of an integrated circuit device. For integrated circuit device embodiment 300 comprises integrated circuit die 210 mounted to substrate 230. Integrated circuit die 210 may comprise a number of bond pads positioned around the periphery of die 210, although, as previously mentioned, embodiments in accordance with claimed subject matter are not limited to bond pads positioned around a periphery. A plurality of the bond pads, for example, may comprise supply voltage bond pads 220. As also previously mentioned, bond pads may be provided for a variety of input or output signal types in addition to supply voltages or ground connections, although signal types are not depicted to reduce potential confusion.

In an embodiment, supply voltage bond pads 220 may be electrically connected to respective supply voltage bond fingers 240, which may in turn be electrically connected to respective supply voltage solder balls 250. Supply voltage bond wires 260 may electrically connect supply voltage bond pads 220 to supply voltage bond fingers 240. Electrically conductive traces or interconnects 275 positioned over, on, or in top or bottom surfaces or layers of substrate 230, as well as electrically conductive vias (not shown) extending from a top surface to a bottom surface of substrate 230, may electrically connect supply voltage bond fingers 240 to supply voltage solder balls 250. A supply voltage applied to supply voltage solder balls 250 may be electrically connected to integrated circuit die 210 by way of supply voltage bond fingers 240, supply voltage bond interconnects 260, or supply voltage bond pads 220. Electrical connections 270 may be positioned between supply voltage solder balls 250 on, in, or over a bottom surface of substrate 230 to electrically interconnect the solder balls. However, claimed subject matter is not limited in scope in these respects.

A pair of supply voltage bond finger interconnects 380 may be connected between supply voltage bond fingers 240, as illustrated in FIG. 3a. Although bond wires may be utilized in an example embodiment to provide electrical connections between pairs of supply voltage bond fingers, claimed subject matter is not limited in scope in this respect. Any electrically conductive interconnect capable of electrically interconnecting two or more bond fingers may be utilized in accordance with claimed subject matter. As explained more fully below, supply voltage bond finger interconnects 380 may provide additional parallelism in an embodiment with respect to inductive properties of a supply voltage net of integrated circuit device 300, thereby reducing overall inductance in a supply voltage net. As noted previously, a reduction in inductance may provide reduced switching noise, and may further allow for an increase in operating clock frequency.

Figure 3B:
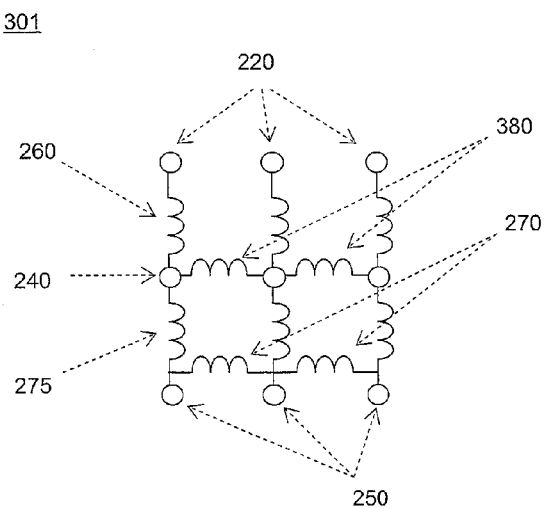
FIG. 3b is a schematic diagram depicting an equivalent circuit of an example embodiment of an integrated circuit device.

FIG. 3b is a schematic diagram depicting an equivalent circuit 301 of a supply voltage net of an example embodiment of integrated circuit device 300 as depicted in FIG. 3a. Inductances inherent in electrical connections between supply voltage bond pads 220 and supply voltage solder balls 250 may be represented by a network of inductors. For example, FIG. 3b depicts inductors representing supply voltage bond interconnects 260 positioned between supply voltage bond pads 220 and supply voltage bond fingers 240, and also depicts inductors representing electrical connections 275 positioned between supply voltage bond fingers 240 and supply voltage solder balls 250. A pair of inductors may also be utilized to represent electrical connections 270 formed between supply voltage solder balls, as depicted in FIG. 2a, and another pair of inductors may represent supply voltage bond finger interconnects 380.

As with example equivalent circuit 201 depicted in FIG. 2b, an example equivalent circuit 301 may comprise a network of inductors characterized by a combination of series or parallel connections. As previously noted, if inductive components are connected in series, total inductance is a sum of individual inductances. Also, as previously noted, the total inductance of two or more parallel inductive components is smaller than the smallest inductance of any individual inductive component. Thus, a total amount of inductance in a supply voltage net represented by example equivalent circuit 301 may be decreased over that seen in equivalent circuit 201 at least in part due to additional parallelism provided by supply voltage bond finger interconnects 380.

Although example embodiments described herein utilize electrically conductive interconnects between supply voltage bond fingers, other embodiments in accordance with claimed subject matter may also or alternatively utilize electrically conductive interconnects between ground voltage bond fingers to reduce inductance in ground nets. Still further, an embodiment may electrically interconnect bond fingers for additional supply voltage nets. In an example embodiment, bond fingers may be electrically interconnected for one or more supply voltage nets or for one or more ground nets.

Figure 4:
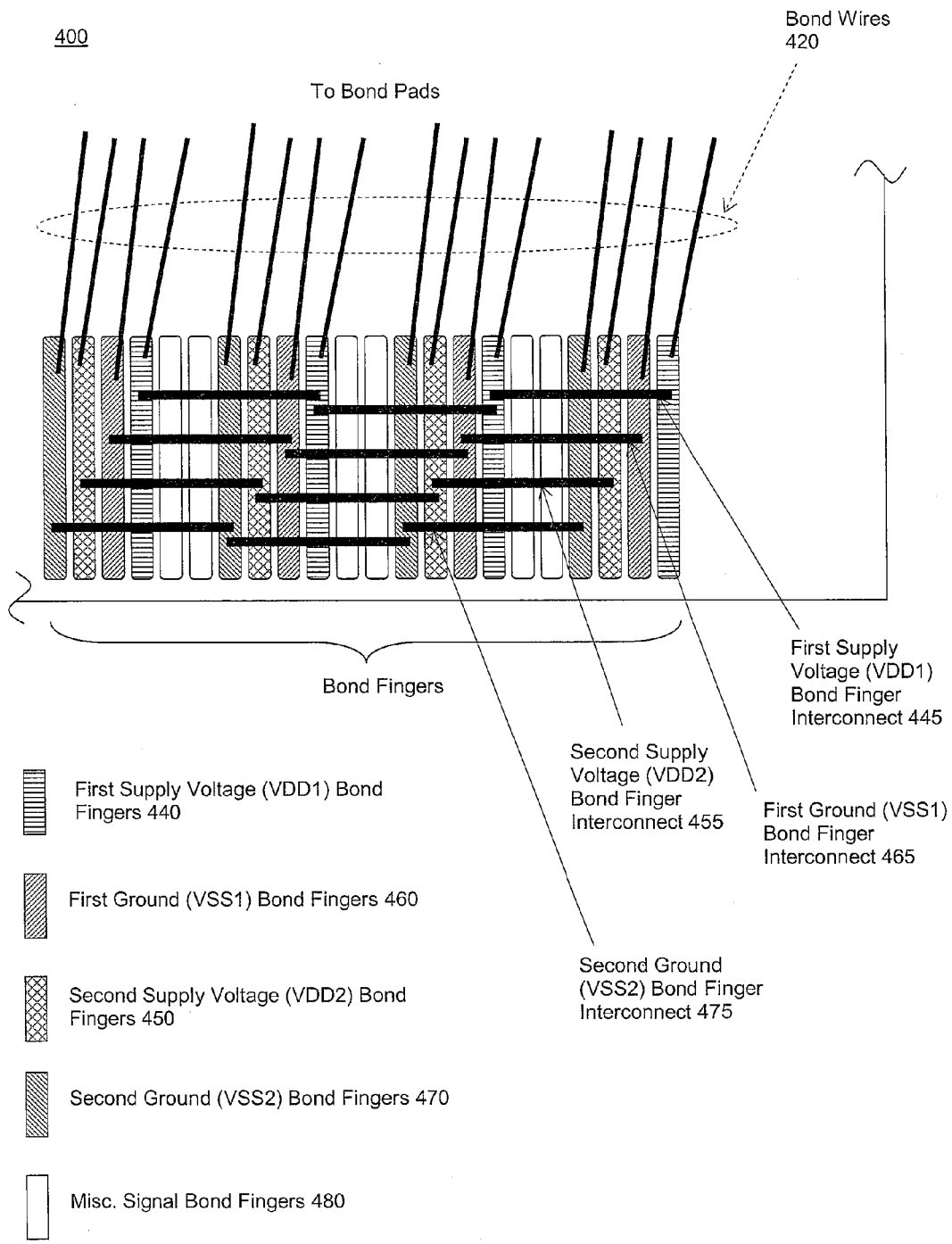
FIG. 4 is a schematic block diagram depicting a portion of a substrate of an example embodiment of an integrated circuit device.

FIG. 4 is a schematic block diagram illustrating a portion of a substrate of an example embodiment 400 of an integrated circuit device. A portion of substrate 400 is shown. Not shown is an integrated circuit die having a number of bond pads, including a plurality of bond pads to receive a first supply voltage VDD1 and a plurality of bond pads to receive a second supply voltage VDD2. The integrated circuit die may also comprise a plurality of bond pads to connect to a first ground source VSS1, a second ground source VSS2, or a number of other bond pads for other miscellaneous signals. Of course, this is merely an example integrated circuit die, and claimed subject matter is not limited in scope to any particular configuration or arrangement of bond pads, supply voltages, ground sources, or signals.

A number of bond fingers are shown in FIG. 4. Substrate 400 has positioned thereon first supply voltage (VDD1) bond fingers 440, second supply voltage (VDD2) bond fingers 450, first ground (VSS1) bond fingers 460, second ground (VSS2) bond fingers 470, or miscellaneous signal bond fingers 480. Of course, arrangement of various bond fingers on substrate 400 is not limited to a particular arrangement, and claimed subject matter is not limited in scope in this respect. FIG. 4 also depicts bond wires 420 to electrically connect VDD1 bond fingers 440 to VDD1 bond pads (not shown), to electrically connect VDD2 bond fingers 450 to VDD2 bond pads (not shown), to connect VSS1 bond fingers 460 to VSS1 bond pads (not shown), or to connect VSS2 bond fingers 470 to VSS2 bond pads (not shown). No bond wires are shown for miscellaneous signal bond fingers 480 to focus discussion on VDD1, VDD2, VSS1, and VSS2 bond fingers. Similarly, no signal traces are shown leading from bond fingers, and no electrically conductive vias are shown in substrate 400, although it is to be understood that signal traces or vias may be implemented in an embodiment. However, claimed subject matter is not limited in scope in these respects.

To reduce overall inductance in supply voltage or ground nets, electrically conductive interconnects join groupings of bond fingers electrically. For example, first supply voltage bond finger interconnects 445 may be utilized to electrically interconnect VDD1 bond fingers 440, and first ground bond finger interconnect 465 may be utilized to electrically interconnect VSS1 bond fingers 460. Similarly, second supply voltage bond finger interconnects 455 may be utilized to electrically interconnect VDD2 bond fingers 450, and second ground bond finger interconnects 475 may be utilized to electrically interconnect VSS2 bond fingers 470, as depicted in FIG. 4. Inductance may be reduced for a VDD1 supply voltage net, a VDD2 supply voltage net, a VSS1 ground net, or a VSS2 ground net for an embodiment. Of course, an amount or arrangement of supply voltage or ground voltage nets for an embodiment are not limited to those depicted in FIG. 4, and claimed subject matter is not limited in scope in this respect.

In addition to reducing inductance, parallel connections for bond finger interconnects depicted in FIG. 4, for example, may increase decoupling capacitance for an integrated circuit device. Increased decoupling capacitance may further improve signal integrity, and may also help allow for increased operating clock frequency.

In an additional embodiment, connections similar to bond finger interconnects as depicted in FIG. 4 may be utilized between bond pads in a further effort to reduce inductance. For example, additional bond wires or other interconnect types may be connected between supply voltage bond pads or between ground source bond pads. In one or more embodiments, a combination of bond pad interconnects and bond finger interconnects may be used to reduce inductance. However, claimed subject matter is not limited in scope in these respects.

Figure 5A:
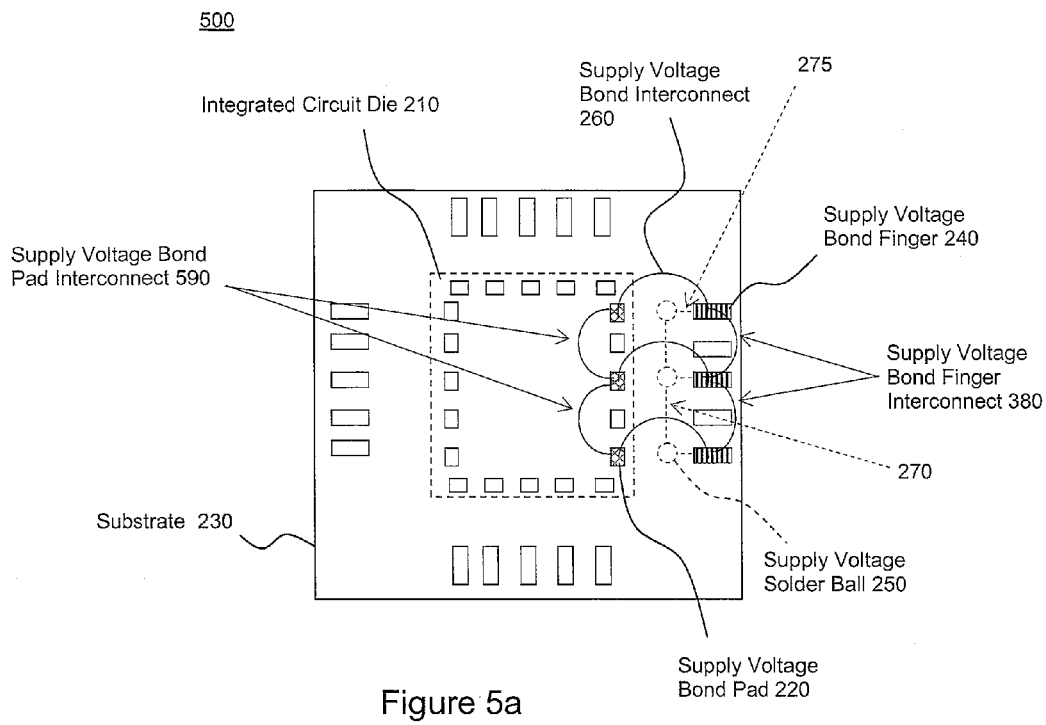
FIG. 5a is an illustration depicting a top view of an example embodiment of an integrated circuit device.

FIG. 5a is an illustration depicting a top view of an example embodiment of an integrated circuit device. For integrated circuit device embodiment 500 comprises integrated circuit die 210 mounted to substrate 230. Integrated circuit die 210 may comprise a number of bond pads positioned around the periphery of die 210, although, as previously mentioned, embodiments in accordance with claimed subject matter are not limited to bond pads positioned around a periphery. A plurality of bond pads, for example, may comprise supply voltage bond pads 220. As also previously mentioned, bond pads may be provided for a variety of input or output signal types in addition to supply voltages or ground connections, although signal types are not depicted to reduce potential confusion.

In an embodiment, supply voltage bond pads 220 may be electrically connected to respective supply voltage bond fingers 240, which may in turn be electrically connected to respective supply voltage solder balls 250. Supply voltage bond wires 260 may electrically connect supply voltage bond pads 220 to supply voltage bond fingers 240. Electrically conductive traces or interconnects 275 positioned on, over, or in top or bottom surfaces or layers of substrate 230, as well as electrically conductive vias (not shown) extending from a top surface to a bottom surface of substrate 230, may electrically connect supply voltage bond fingers 240 to supply voltage solder balls 250. A supply voltage applied to supply voltage solder balls 250 may be electrically connected to integrated circuit die 210 by way of supply voltage bond fingers 240, supply voltage bond interconnects 260, or supply voltage bond pads 220. Electrical connections 270 may be positioned between supply voltage solder balls 250 on, over, or in a bottom surface of substrate 230 to electrically interconnect the solder balls. However, claimed subject matter is not limited in scope in these respects.

A pair of supply voltage bond finger interconnects 380 may be connected between supply voltage bond fingers 240, as illustrated in FIG. 5a. Although bond wires may be utilized in an example embodiment to provide electrical connections between pairs of supply voltage bond fingers, claimed subject matter is not limited in scope in this respect. Any electrically conductive interconnect capable of electrically interconnecting two or more bond fingers may be utilized in accordance with claimed subject matter. Similarly, for an example embodiment, a pair of supply voltage bond pad interconnects 590 may be connected between supply voltage bond pads 220, as further illustrated in FIG. 5a. Although bond wires may be utilized in an example embodiment to provide electrical connections between pairs of supply voltage bond pads, claimed subject matter is not limited in scope in this respect. Any electrically conductive interconnect capable of electrically interconnecting two or more bond pads may be utilized in accordance with claimed subject matter. As explained more fully below, supply voltage bond finger interconnects 380 or supply voltage bond pad interconnects 590 may provide additional parallelism in an embodiment with respect to inductive properties of a supply voltage net of integrated circuit device 500, thereby reducing overall inductance in a supply voltage net. As noted previously, a reduction in inductance may provide reduced switching noise, and may further allow for an increase in operating clock frequency.

Although example embodiment 500 of an integrated circuit device depicted in depicted in FIG. 5a includes supply voltage bond pad interconnects and supply voltage bond finger interconnects, other embodiments may utilize supply voltage bond finger interconnects and may not utilize supply voltage bond pad interconnects. Further embodiments may utilize supply voltage bond pad interconnects and may not utilize supply voltage bond finger interconnects. However, these are merely examples, and claimed subject matter is not limited in scope in these respects.

Figure 5B:
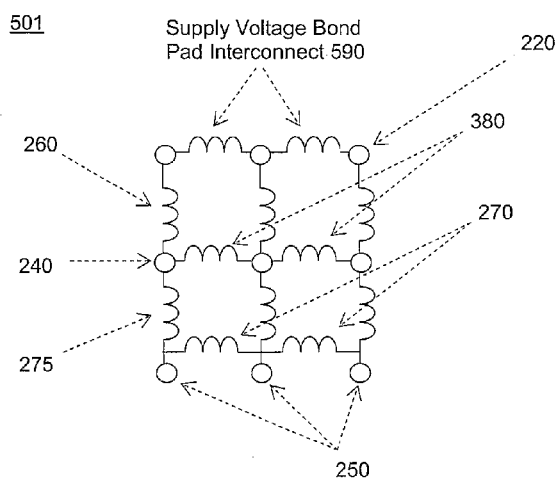
FIG. 5b is a schematic diagram depicting an equivalent circuit of an example embodiment of an integrated circuit device.

FIG. 5b is a schematic diagram depicting an equivalent circuit 501 of a supply voltage net of an example embodiment of integrated circuit device 500 as depicted in FIG. 5a. Inductances inherent in electrical connections between supply voltage bond pads 220 and supply voltage solder balls 250 may be represented by a network of inductors. For example, FIG. 5b depicts inductors representing supply voltage bond interconnects 260 positioned between supply voltage bond pads 220 and supply voltage bond fingers 240, and also depicts inductors representing electrical connections 275 positioned between supply voltage bond fingers 240 and supply voltage solder balls 250. A pair of inductors may also be utilized to represent electrical connections 270 formed between supply voltage solder balls, as depicted in FIG. 5a, and another pair of inductors may represent supply voltage bond finger interconnects 380. A pair of inductors may also represent supply voltage bond pad interconnects 590.

As with example equivalent circuits 201 and 301 depicted in FIGS. 2b and 3b, respectively, an example equivalent circuit 501 may comprise a network of inductors characterized by a combination of series or parallel connections. As previously noted, if inductive components are connected in series, total inductance is a sum of individual inductances. Also, as previously noted, total inductance of two or more parallel inductive components is smaller than a smallest inductance of any individual inductive component. Thus, a total amount of inductance in a supply voltage net represented by example equivalent circuit 501 may be decreased over that seen in equivalent circuits 201 or 301 at least in part due to additional parallelism provided by supply voltage bond pad interconnects 590.

Although example embodiments described herein utilize electrically conductive interconnects between supply voltage bond pads, other embodiments in accordance with claimed subject matter may also or alternatively utilize electrically conductive interconnects between ground voltage bond pads to reduce inductance in ground nets. Still further, an embodiment may electrically interconnect bond pads for additional supply voltage nets. In an example embodiment, bond pads may be electrically interconnected for one or more supply voltage nets or for one or more ground nets.

Figure 6:
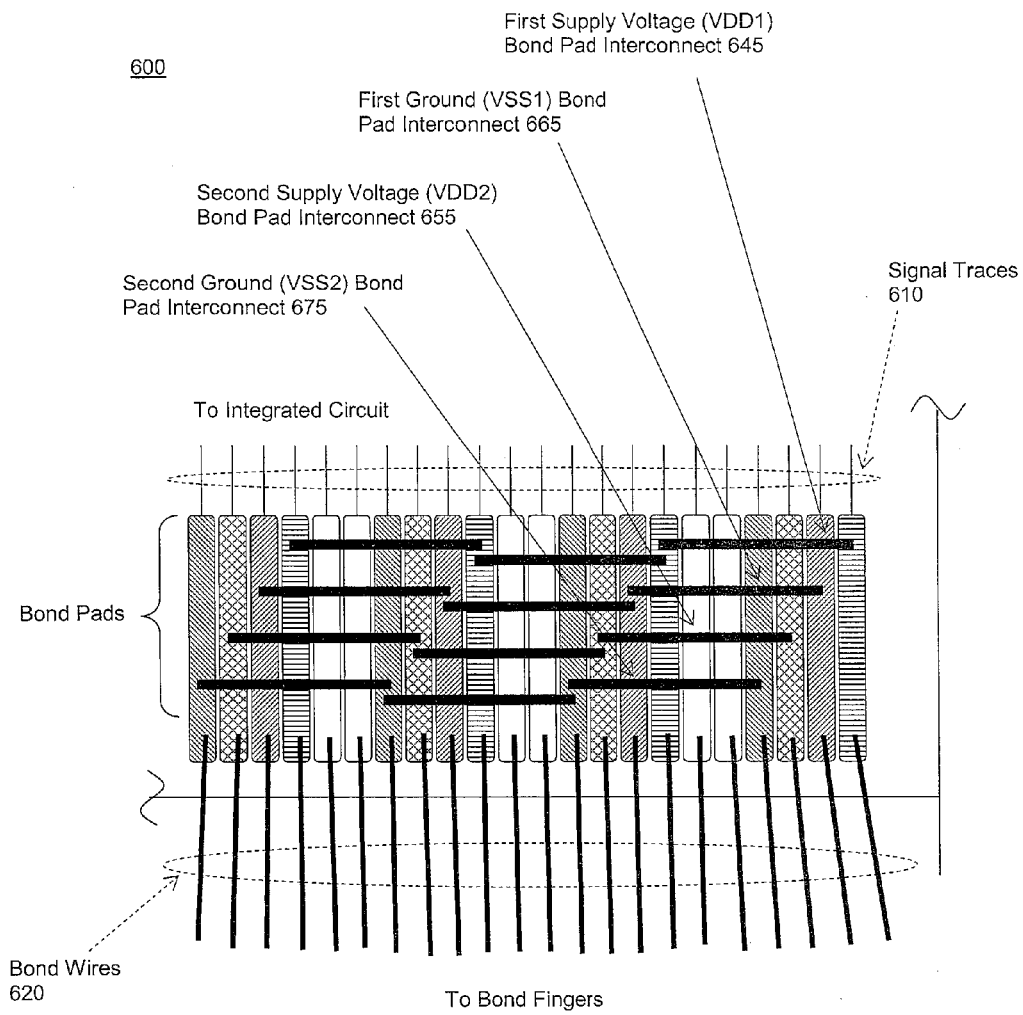
FIG. 6 is a schematic block diagram depicting a portion of an example embodiment of an integrated circuit die of an integrated circuit device.
Figure 6:
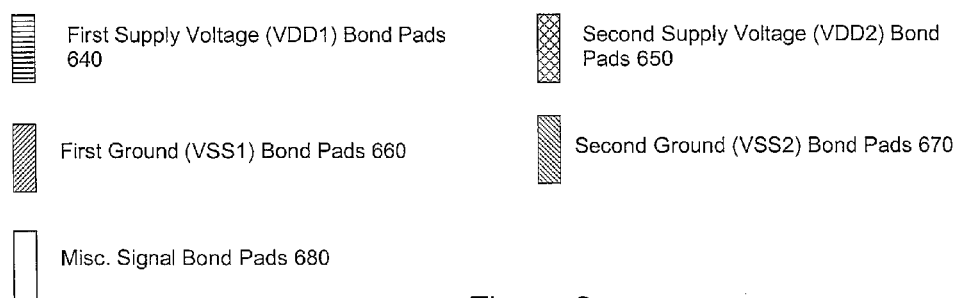

FIG. 6 is a schematic block diagram illustrating a portion of an integrated circuit die of an example embodiment 600 of an integrated circuit device. A portion of integrated circuit die 600 is shown. Not shown is an integrated circuit device substrate having a number of bond fingers, including a plurality of bond fingers to receive a first supply voltage VDD1 and a plurality of bond fingers to receive a second supply voltage VDD2. An integrated circuit device substrate may also comprise a plurality of bond fingers to connect to a first ground source VSS1, a second ground source VSS2, or a number of other bond fingers for other miscellaneous signals. Of course, this is merely an example integrated circuit device substrate, and claimed subject matter is not limited in scope to any particular configuration or arrangement of bond fingers, supply voltages, ground sources, or signals.

A number of bond pads are shown in FIG. 6. Integrated circuit die 600 has positioned thereon first supply voltage (VDD1) bond pads 640, second supply voltage (VDD2) bond pads 650, first ground (VSS1) bond pads 660, second ground (VSS2) bond pads 670, or miscellaneous signal bond pads 680. Of course, arrangement of various bond pads over, on, or in integrated circuit die 600 is not limited to a particular arrangement, and claimed subject matter is not limited in scope in this respect. FIG. 6 also depicts bond wires 620 to electrically connect VDD1 bond pads 640 to VDD1 bond fingers (not shown), to electrically connect VDD2 bond pads 650 to VDD2 bond fingers (not shown), to connect VSS1 bond pads to VSS1 bond fingers (not shown), or to connect VSS2 bond pads to VSS2 bond fingers (not shown). Signal traces 610 are shown leading from bond pads to various circuitry of integrated circuit die 600, although claimed subject matter is not limited in scope in this respect. Further, no electrically conductive vias are shown in integrated circuit die 600, although it is to be understood that signal traces or vias may be implemented in an embodiment. However, claimed subject matter is not limited in scope in these respects.

To reduce overall inductance in supply voltage or ground nets, electrically conductive interconnects join groupings of bond pads electrically. For example, first supply voltage bond pad interconnects 645 may be utilized to electrically interconnect VDD1 bond pads 640, and first ground bond pad interconnect 665 may be utilized to electrically interconnect VSS1 bond pads 660. Similarly, second supply voltage bond pad interconnects 655 may be utilized to electrically interconnect VDD2 bond pads 650, and second ground bond pad interconnects 675 may be utilized to electrically interconnect VSS2 bond pads 670, as depicted in FIG. 6. Inductance may be reduced for a VDD1 supply voltage net, a VDD2 supply voltage net, a VSS1 ground net, or a VSS2 ground net for an embodiment. Of course, an amount or arrangement of supply voltage or ground voltage nets for an embodiment is not limited to those depicted in FIG. 6, and claimed subject matter is not limited in scope in this respect.

In addition to reducing inductance, parallel connections for bond pad interconnects depicted in FIG. 6, for example, may increase decoupling capacitance for an integrated circuit device. Increased decoupling capacitance may further improve signal integrity, and may also help allow for increased operating clock frequency. For increased decoupling capacitance, power and ground bond pad interconnects may be implemented in an alternating fashion, as depicted in FIG. 6. Also, power and ground bond pad interconnects may be positioned in relatively close proximity one to another for increased decoupling capacitance.

As seen in various example embodiments described herein, connections between bond pad interconnects may be utilized between bond pads in an effort to reduce inductance. In other example embodiments, additional bond wires or other interconnect types may be connected between supply voltage bond fingers or between ground source bond fingers. In one or more embodiments, a combination of bond pad interconnects and bond finger interconnects may be used to reduce inductance. However, claimed subject matter is not limited in scope in these respects.

Figure 7:
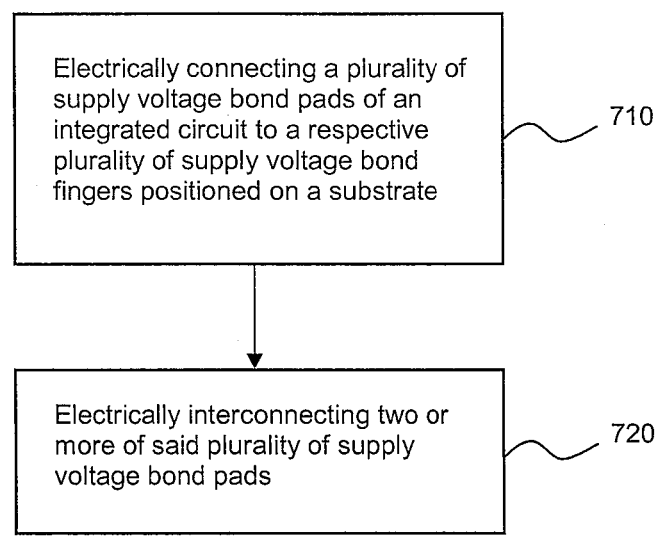
FIG. 7 is a flow diagram illustrating an example embodiment of a process for electrically interconnecting supply voltage bond pads in an embodiment of an integrated circuit device.

FIG. 7 is a flow diagram illustrating an example embodiment of a process for electrically interconnecting supply voltage bond pads in an integrated circuit device. At block 710, a plurality of supply voltage bond pads of an integrated circuit may be electrically connected to a respective plurality of supply voltage bond fingers positioned over, in, or on a first surface of a substrate. At block 720, two or more of the plurality of supply voltage bond pads may be electrically interconnected. Embodiments in accordance with claimed subject matter may include all of, less than, or more than blocks 710-720. Also, the order of blocks 710-720 is merely an example order, and claimed subject matter is not limited in scope in this respect.

In another embodiment, electrically interconnecting two or more of a plurality of supply voltage bond fingers may comprise electrically connecting one or more wires to two or more of the plurality of supply voltage bond fingers. Also for an embodiment, a plurality of solder balls may be electrically connected to one or more of the plurality of supply voltage bond fingers, and two or more of the solder balls may be electrically interconnected by an electrically conductive interconnects positioned on, over, or in a second surface of the substrate.

In a further embodiment, a plurality of ground voltage bond pads of an integrated circuit may be electrically connected to a respective plurality of ground voltage bond fingers positioned on, over, or in the first surface of the substrate, and two or more of the plurality of ground voltage bond pads may be electrically interconnected. Also, in an embodiment, a plurality of second supply voltage bond pads of an integrated circuit may be electrically connected to a respective plurality of second supply voltage bond fingers formed on, over, or in the first surface of the substrate. Further, for an embodiment, two or more of the plurality of second supply voltage bond pads may be electrically interconnected via one or more second supply voltage bond pad interconnects. Also, for an embodiment, a plurality of second ground voltage bond pads of an integrated circuit may be electrically connected to a respective plurality of second ground voltage bond fingers positioned on, over, or in the first surface of the substrate, and two or more of the plurality of second ground voltage bond pads may be electrically interconnected.

Figure 8:
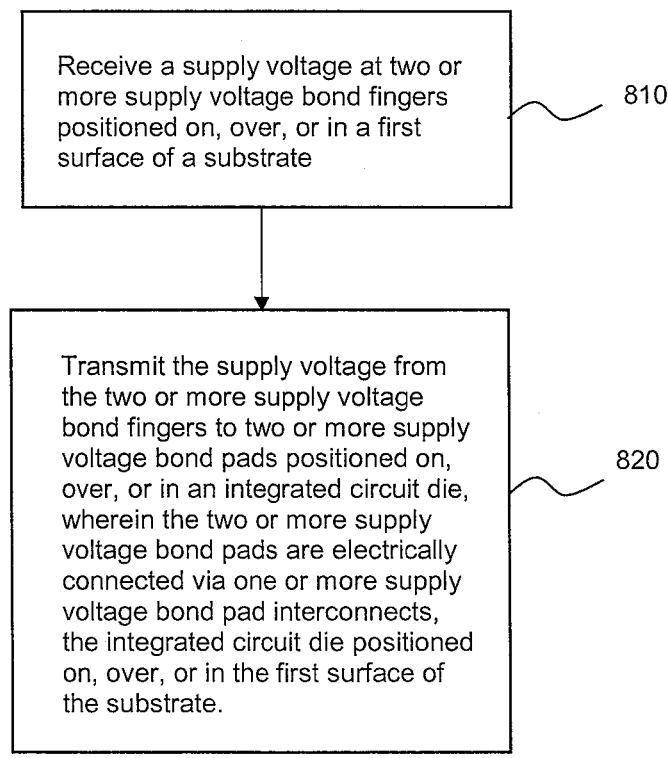
FIG. 8 is a flow diagram illustrating an example embodiment of a process for receiving a supply voltage at an embodiment of an integrated circuit device.

FIG. 8 is a flow diagram illustrating an example embodiment of a process for receiving a supply voltage at an embodiment of an integrated circuit device. At block 810, a supply voltage may be received at two or more supply voltage bond fingers positioned on a first surface of a substrate. At block 820, a supply voltage may be transmitted from the two or more supply voltage bond fingers to two or more supply voltage bond pads positioned on, over, or in an integrated circuit die, and two or more supply voltage bond pads may be electrically connected via one or more supply voltage bond pad interconnects. An integrated circuit die may be positioned on, over, or in the first surface of the substrate. Embodiments in accordance with claimed subject matter may include all, less than, or more than blocks 810-820. Also, the order of blocks 810-820 is merely an example order, and claimed subject matter is not limited in scope in this respect.

Referring again to FIG. 1, integrated circuit embodiment 100 may be manufactured at least in part by mounting integrated circuit die 110 on, over, or in substrate 130. Bond interconnects 160 may be connected between a plurality of bond pads on, over, or in integrated circuit die 110 and a plurality of bond fingers positioned on, over, or in substrate 130. One or more bond fingers may be electrically connected to one or more solder balls 150.

Referring to FIG. 2a, 3a, or 5a, supply voltage bond interconnects 260 may be electrically connected between supply voltage bond pads 220 and supply voltage bond finger 240. In an embodiment, supply voltage bond interconnects 260 may be soldered to supply voltage bond pads 220 and supply voltage bond fingers 240. Additionally, for an embodiment, supply voltage solder ball interconnects 270 may be connected between two or more supply voltage solder balls 250. Also, supply voltage bond finger interconnects 380 may be electrically connected between supply voltage bond fingers 240. In an embodiment, supply voltage finger interconnects 380 may be soldered to supply voltage bond fingers 240. Further supply voltage bond pad interconnects 590 may be electrically connected between supply voltage bond pads 220. In an embodiment, supply voltage bond pad interconnections 590 may be soldered to supply voltage bond pads 220. Of course, embodiments of manufacturing processes for an integrated circuit device, such as integrated circuit devices 100, are not limited to examples described herein, and claimed subject matter is not limited in scope in this respect.

Figure 9:
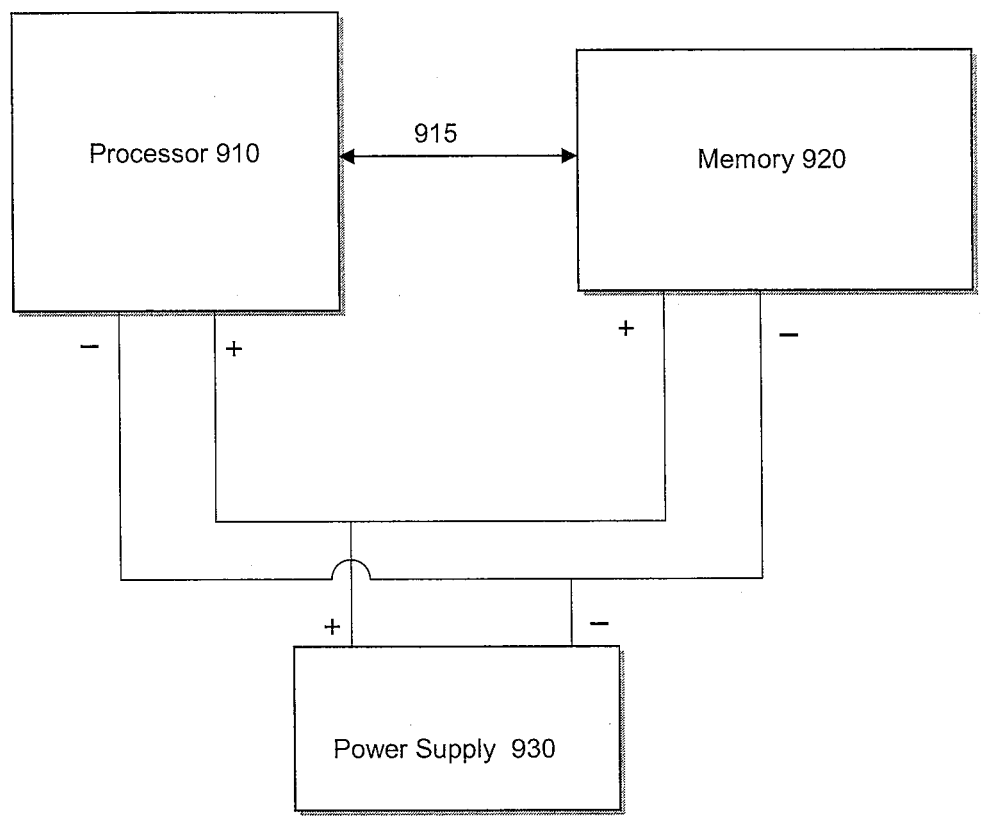
FIG. 9 is a schematic block diagram depicting an example embodiment of a system including an example embodiment of a non-volatile memory device.

FIG. 9 is a schematic block diagram depicting an example embodiment of a system, computing platform 900, including an example embodiment of a memory device, such as a double data rate (DDR) memory device 920. DDR memory device 920 may be implemented in accordance with claimed subject matter to reduce inductance in supply voltage or ground nets to reduce switching noise. Any or all example embodiments described herein, as well as other embodiments, may be utilized in implementing memory device 920. Similarly, an embodiment may also be utilized in implementing a processor 910, which, for example, may be coupled to memory device 920 by way of an interface 915. For one or more embodiments, one or more supply voltages may be supplied by a power supply 930, which, in an embodiment, may comprise a battery. However, claimed subject matter is not limited in scope in this respect. Other systems implemented in accordance with claimed subject matter may utilize other types of power sources, for example.

A supply voltage delivered by power supply 930 may be applied to one or more solder balls of a ball grid array for memory device 920, and a supply voltage may be electrically connected with a plurality of bond pads on, over, or in an integrated circuit within memory device 920 by way of a plurality of bond fingers and bond wires, for example. Supply voltage bond pads may be electrically interconnected using bond pad interconnects, for example.

The term "computing platform" as used herein refers to a system, subsystem, or a device that includes the ability to process or store data in the form of signals. Thus, a computing platform, in this context, may comprise hardware, software, firmware or any combination thereof. Computing platform 900, as depicted in FIG. 9, is merely an example, and claimed subject matter is not limited in scope in these respects. For one or more embodiments, a computing platform may comprise any of a wide range of digital electronic devices, including, but not limited to, personal desktop or notebook computers, high-definition televisions, digital versatile disc (DVD) players or recorders, game consoles, satellite television receivers, cellular telephones, personal digital assistants, mobile audio or video playback or recording devices, and so on. Further, unless specifically stated otherwise, a process, such as those described herein, with reference to flow diagrams or otherwise, may also be executed or controlled, in whole or in part, by a computing platform.

Reference throughout this specification to "one embodiment" or "an embodiment" may mean that a particular feature, structure, or characteristic described in connection with a particular embodiment may be included in at least one embodiment of claimed subject matter. Thus, appearances of the phrase "in one embodiment" or "an embodiment" in various places throughout this specification are not necessarily intended to refer to the same embodiment or to any one particular embodiment described. Furthermore, it is to be understood that particular features, structures, or characteristics described may be combined in various ways in one or more embodiments. In general, of course, these and other issues may vary with the particular context of usage. Therefore, the particular context of the description or the usage of these terms may provide helpful guidance regarding inferences to be drawn for that context.

Likewise, the terms, "and" and "or" as used herein may include a variety of meanings that also is expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe some combination of features, structures or characteristics. Though, it should be noted that this is merely an illustrative example and claimed subject matter is not limited to this example.

In the preceding description, various aspects of claimed subject matter have been described. For purposes of explanation, systems or configurations were set forth to provide an understanding of claimed subject matter. However, claimed subject matter may be practiced without those specific details. In other instances, well-known features were omitted or simplified so as not to obscure claimed subject matter. While certain features have been illustrated or described herein, many modifications, substitutions, changes or equivalents will now occur to those skilled in the art. It is, therefore, to be understood that the appended claims are intended to cover all such modifications or changes as fall within the true spirit of claimed subject matter.

The invention claimed is:

1. An integrated circuit device, comprising:
   an integrated circuit die comprising a plurality of supply voltage bond pads;
   one or more supply voltage bond pad interconnects, each supply voltage bond pad interconnect electrically connected to two or more of the plurality of supply voltage bond pads;
   a substrate having a plurality of supply voltage bond fingers individually electrically connected to one or more of the plurality of supply voltage bond pads via one or more supply voltage bond interconnects; and
   one or more supply voltage bond finger interconnects, each supply voltage bond finger interconnect electrically interconnecting two or more of the plurality of supply voltage bond fingers.

2. The integrated circuit device of claim 1, wherein the plurality of supply voltage bond pads individually comprise a primary bond pad area and a supplemental bond pad area, wherein the one or more supply voltage bond interconnects are connected between the one or more of the plurality of supply voltage bond fingers and one or more primary bond pad areas of the supply voltage bond pads, and wherein one or more supply voltage bond pad interconnects are electrically connected to the supplemental bond pad areas of two or more of the plurality of supply voltage bond pads.

3. The integrated circuit device of claim 2, further comprising a plurality of solder balls positioned on, over, or in a second surface of the substrate, wherein the integrated circuit and the plurality of bond fingers are positioned on, over, or in a first surface of said substrate, wherein the plurality of solder balls are individually electrically coupled to one or more of the plurality of supply voltage bond fingers through one or more electrically conductive traces or electrically conductive vias extending from the first surface to the second surface of the substrate, wherein two or more of the plurality of solder balls are electrically interconnected via an electrically conductive interconnect.

4. The integrated circuit device of claim 1, wherein the integrated circuit die further comprises a plurality of ground voltage bond pads, and wherein said first surface of the substrate further has positioned thereon, there above, or therein, a plurality of ground voltage bond fingers individually connected to two or more of the plurality of ground voltage bond pads via one or more ground voltage bond interconnects.

5. The integrated circuit device of claim 4, further comprising one or more ground voltage bond pad interconnects, each ground bond pad interconnect electrically connected to two or more of the plurality of ground voltage bond pads.

6. The integrated circuit device of claim 1, wherein the supply voltage bond pads comprise first supply voltage bond pads, the supply voltage bond fingers comprise first supply voltage bond fingers, said supply voltage bond interconnects comprise first supply voltage bond interconnects, and said supply voltage bond pad interconnects comprise first supply voltage bond pad interconnects, wherein the integrated circuit die further comprises a plurality of second supply voltage bond pads, and wherein said substrate further has positioned thereon, there above, or therein, a plurality of second supply voltage bond fingers individually connected to two or more of the plurality of second supply voltage bond pads via one or more second supply voltage bond interconnects.

7. The integrated circuit device of claim 5, further comprising one or more second supply voltage bond pad interconnects, each second supply voltage bond pad interconnect electrically connected to two or more of the plurality of second supply voltage bond pads.

8. A method, comprising:
   electrically connecting a plurality of supply voltage bond pads of an integrated circuit to a respective plurality of supply voltage bond fingers positioned on, over, or in a first surface of a substrate;
   electrically interconnecting two or more of the plurality of supply voltage bond pads, wherein the supply voltage bond pads are electrically interconnected by one or more supply voltage bond pad interconnects; and
   electrically interconnecting two or more of the plurality of supply voltage bond fingers, wherein the supply voltage bond fingers are electrically interconnected by one or more supply voltage bond finger interconnects.

9. The method of claim 8, further comprising electrically connecting a plurality of solder balls to one or more of the plurality of supply voltage bond fingers.

10. The method of claim 9, further comprising:
    electrically connecting two or more of the plurality of solder fingers via one or more electrically conductive interconnects positioned on, over, or in the first surface of the substrate; and
    electrically connecting two or more of the plurality of solder balls via one or more electrically conductive interconnects positioned on, over, or in the second surface of the substrate.

11. The method of claim 8, further comprising:
    electrically connecting a plurality of ground voltage bond pads of the integrated circuit to a respective plurality of ground voltage bond fingers positioned on, over, or in the first surface of the substrate; and
    electrically interconnecting two or more of said plurality of ground voltage bond pads.

12. The method of claim 8, wherein the supply voltage bond pads comprise first supply voltage bond pads, the supply voltage bond fingers comprise first supply voltage bond fingers, the supply voltage bond wires comprise first supply voltage bond wires, and the supply voltage bond pad interconnects comprise first supply voltage bond pad interconnects, and wherein the method further comprises:
    electrically connecting a plurality of second supply voltage bond pads of the integrated circuit to a respective plurality of second supply voltage bond fingers positioned on, over, or in the first surface of the substrate; and
    electrically interconnecting two or more of the plurality of second supply voltage bond pads via one or more second supply voltage bond pad interconnects.

13. A system, comprising:
a power supply to generate a first supply voltage;
a processor; and
a memory device coupled to the processor, the memory device to receive the first supply voltage from the power supply, the memory device comprising
an integrated circuit die comprising a plurality of first supply voltage bond pads;
one or more first supply voltage bond pad interconnects, each supply voltage bond pad interconnect electrically connected to two or more of the plurality of first supply voltage bond pads;
a substrate having positioned thereon, there above, or therein, a plurality of first supply voltage bond fingers individually electrically connected to one or more of the plurality of first supply voltage bond pads via one or more first supply voltage bond interconnects; and
one or more first supply voltage bond finger interconnects, each supply voltage bond finger interconnect electrically interconnecting two or more of the plurality of first supply voltage bond fingers.

14. The system of claim 13, wherein the substrate comprises a first and a second surface, wherein the second surface of the substrate has positioned thereon, there above, or therein, a plurality of solder balls to receive said first supply voltage from the power supply, the plurality of solder balls individually electrically connected to one or more of the plurality of first supply voltage bond fingers.

15. The system of claim 14, wherein two or more of the plurality of solder balls are electrically connected via one or more electrically conductive interconnects formed on, over, or in one or more of the first and second surfaces of the substrate, and wherein two or more of the plurality of first supply voltage bond fingers are electrically connected via one or more first supply voltage bond finger interconnects.

16. The system of claim 13, wherein the integrated circuit die further comprises a plurality of ground voltage bond pads, and wherein the first surface of the substrate further has positioned thereon, there above, or therein, a plurality of ground voltage bond fingers individually connected to one or more of the plurality of ground voltage bond pads via one or more ground voltage bond interconnects.

17. The system of claim 16, wherein the memory device further comprises one or more ground voltage bond pad interconnects, each ground voltage bond pad interconnect electrically connected to two or more of the plurality of ground voltage bond pads.

18. The system of claim 13, the power supply further to generate a second supply voltage, wherein the integrated circuit die further comprises a plurality of second supply voltage bond pads, and wherein the substrate further has positioned thereon, there above, or therein, a plurality of second supply voltage bond fingers individually electrically connected to one or more of the plurality of second supply voltage bond pads via one or more second supply voltage bond interconnects.

19. The system of claim 18, the memory device further comprising one or more second supply voltage bond pad interconnects, each second supply voltage bond pad interconnect electrically connected to two or more of the plurality of second supply voltage bond pads.

* * * * *